United States Patent
Sakurai et al.

(10) Patent No.: US 10,566,208 B2
(45) Date of Patent: Feb. 18, 2020

(54) PLASMA ETCHING METHOD

(71) Applicant: ZEON CORPORATION, Chiyoda-ku, Tokyo (JP)

(72) Inventors: Takaaki Sakurai, Tokyo (JP); Hirotoshi Inui, Tokyo (JP)

(73) Assignee: ZEON CORPORATION, Chiyoda-ku, Tokyo (JP)

( * ) Notice: Subject to any disclaimer, the term of this patent is extended or adjusted under 35 U.S.C. 154(b) by 0 days.

(21) Appl. No.: 16/324,982

(22) PCT Filed: Jul. 21, 2017

(86) PCT No.: PCT/JP2017/026553
§ 371 (c)(1),
(2) Date: Feb. 12, 2019

(87) PCT Pub. No.: WO2018/037799
PCT Pub. Date: Mar. 1, 2018

(65) Prior Publication Data
US 2019/0228983 A1 Jul. 25, 2019

(30) Foreign Application Priority Data
Aug. 25, 2016 (JP) .................. 2016-165009

(51) Int. Cl.
H01L 21/311 (2006.01)
H01L 21/3065 (2006.01)

(52) U.S. Cl.
CPC .... *H01L 21/31116* (2013.01); *H01L 21/3065* (2013.01)

(58) Field of Classification Search
CPC ..................................... H01L 21/311
See application file for complete search history.

(56) References Cited

U.S. PATENT DOCUMENTS
2014/0073139 A1  3/2014  Suzuki

FOREIGN PATENT DOCUMENTS
WO    2012124726 A1    9/2012

OTHER PUBLICATIONS

Feb. 26, 2019, International Preliminary Report on Patentability issued in the International Patent Application No. PCT/JP2017/026553.

*Primary Examiner* — Roberts P Culbert
(74) *Attorney, Agent, or Firm* — Kenja IP Law PC

(57) ABSTRACT

A plasma etching method for etching a multilayer laminate in which a silicon oxide film and a silicon nitride film are stacked includes an etching step of plasma etching the silicon oxide film and the silicon nitride film using a gas of a non-bromine-containing fluorocarbon together with a gas of a bromine-containing fluorocarbon compound represented by a compositional formula $C_3H_2BrF_3$.

3 Claims, No Drawings

PLASMA ETCHING METHOD

TECHNICAL FIELD

The present disclosure relates to a plasma etching method and, in particular, relates to a plasma etching method for etching a silicon nitride film and a silicon oxide film in the same etching step.

BACKGROUND

In semiconductor device manufacturing, plasma etching using a processing gas may be carried out in fine processing of a thin film formed on a workpiece. The thin film may, for example, be a silicon compound film such as a silicon nitride film or a silicon oxide film, an organic film having carbon as a main component that is formed from amorphous carbon, a photoresist composition, or the like, or an inorganic film having an inorganic substance as a main component that is formed from a polycrystalline silicon film, amorphous silicon, or the like. In a case in which one or more specific thin films from among these thin films are etching processing targets and other films are non-processing targets, it is necessary to selectively etch processing targets relative to non-processing targets formed on the same workpiece. In other words, it is necessary to increase the selectivity in etching. Moreover, in recent years, there has been demand for further reduction of environmental impact in semiconductor device manufacturing.

For this reason, plasma etching methods for selectively etching a silicon oxide film on a substrate (workpiece) have been proposed (for example, refer to PTL 1). PTL 1 discloses a plasma etching method that uses a plasma etching gas containing a C3 or C4 fluorocarbon that includes a bromine atom and at least one unsaturated bond and/or ether bond. This plasma etching method enables excellent etching selectivity of a silicon oxide film using a plasma etching gas that has a short atmospheric lifetime and comparatively low environmental impact.

CITATION LIST

Patent Literature

PTL 1: WO 2012/124726 A1

SUMMARY

Technical Problem

In recent years, it has become necessary to deal with a plurality of types of films such as described above as processing targets. Specifically, in the manufacture of NAND flash memory, which has been the subject of increasing demand in recent years, it is necessary to etch a laminate in which silicon oxide and silicon nitride films are stacked over multiple layers in order to form a hole. However, although plasma etching using the specific plasma etching gas having low environmental impact that is described in PTL 1 enables etching of a silicon oxide film, it has not been possible to etch a silicon nitride film in the same etching step by this plasma etching.

Accordingly, an objective of the present disclosure is to provide a plasma etching method that uses a plasma etching gas having low environmental impact and enables highly selective etching of a silicon oxide film and a silicon nitride film in the same etching step.

Solution to Problem

The inventors conducted diligent studies with the aim of solving the problem set forth above. Through these studies, the inventors discovered that etching of a silicon oxide film and a silicon nitride film can be performed in an etching step in which a gas of a non-bromine-containing fluorocarbon and a gas of a bromine-containing fluorocarbon compound having comparatively low environmental impact that is represented by a compositional formula $C_3H_2BrF_3$ and includes at least one unsaturated bond are used together as a processing gas for plasma etching, and thereby completed the present disclosure.

Specifically, the present disclosure aims to advantageously solve the problem set forth above by disclosing a plasma etching method for etching a multilayer laminate in which a silicon oxide film and a silicon nitride film are stacked, comprising an etching step of plasma etching the silicon oxide film and the silicon nitride film using a gas of a non-bromine-containing fluorocarbon together with a gas of a bromine-containing fluorocarbon compound represented by a compositional formula $C_3H_2BrF_3$ that is at least one of 2-bromo-3,3,3-trifluoropropene, (Z)-1-bromo-3,3,3-trifluoropropene, (E)-1-bromo-3,3,3-trifluoropropene, and 3-bromo-2,3,3-trifluoropropene. In an etching step in which a gas of a non-bromine-containing fluorocarbon and a gas of any of these specific bromine-containing fluorocarbon compounds are used together, a silicon oxide film and a silicon nitride film can both be etched with high selectivity in the same etching step.

Note that the phrase "in the same etching step" as used in the present specification means in one etching step during which etching conditions are not intentionally changed. When a laminate in which silicon oxide and silicon nitride films are stacked over multiple layers is used as a workpiece in this etching step, it may be the case that only one of a silicon oxide film and a silicon nitride film is etched at a certain timing during the majority of the etching step because etching proceeds sequentially through the layers, but etching of both a silicon oxide film and a silicon nitride film may occur at the same timing during a period when etching is occurring near a boundary between layers. In other words, in the presently disclosed plasma etching method, a silicon oxide film and a silicon nitride film may be etched during the same etching step, and simultaneously as necessary.

In the presently disclosed plasma etching method, a volume ratio of the gas of the non-bromine-containing fluorocarbon relative to the gas of the bromine-containing fluorocarbon compound in the etching step is preferably less than 2.5. This is because selectivity in etching can be further improved by using both gases mixed in this specific ratio.

The phrase "volume ratio of the gas of the non-bromine-containing fluorocarbon" as used in the present disclosure refers to the ratio of volume of the gas of the non-bromine-containing fluorocarbon when the volume of the gas of the bromine-containing fluorocarbon compound is taken to be 1. Note that the volumes of the gases are values corresponding to the rates at which these gases are introduced into a processing vessel in the etching step. In other words, the "volume ratio of the gas of the non-bromine-containing fluorocarbon" may be a value that expresses the rate at which the gas of the non-bromine-containing fluorocarbon is introduced into the processing vessel in the etching step as a number of multiples of the gas of the bromine-containing fluorocarbon compound.

In the presently disclosed plasma etching method, the gas of the bromine-containing fluorocarbon compound preferably includes 2-bromo-3,3,3-trifluoropropene gas. This is because selectivity in etching can be further improved.

Advantageous Effect

According to the present disclosure, it is possible to provide a plasma etching method that uses a plasma etching gas having comparatively low environmental impact and enables etching of a silicon oxide film and a silicon nitride film in the same etching step.

DETAILED DESCRIPTION

The following provides a detailed description of embodiments of the present disclosure. The presently disclosed plasma etching method can be used in a manufacturing process of a semiconductor device. The presently disclosed plasma etching method is a plasma etching method that enables plasma etching of a workpiece having a multilayer laminate structure in which silicon oxide and silicon nitride films are stacked as a plurality of layers (hereinafter, also referred to as a "multilayer laminate" for simplicity). The workpiece may be any type of target without any specific limitations so long as it can be used in plasma etching. For example, the workpiece may include a glass substrate, a monocrystalline silicon wafer, or a gallium arsenide substrate. Moreover, the workpiece may, for example, include a silicon nitride film and, as necessary, a silicon oxide film, an organic film, and/or an inorganic film that are formed on a monocrystalline silicon wafer.

The term "silicon oxide film" as used in the present specification refers to a film formed from an oxygen atom-containing silicon compound such as $SiO_2$, SiOC, or SiOCH. Moreover, the term "silicon nitride film" as used in the present specification refers to a film formed from a nitrogen atom-containing silicon compound such as $Si_3N_4$ (SiN), SiCN, or SiBCN. Furthermore, the term "organic film" as used in the present specification refers to a film having carbon as a main component. Note that "having carbon as a main component" means that the proportion in which carbon is contained in a material forming the film is more than 50 mass %. Specifically, this refers to a carbon based-material such as amorphous carbon or a film formed from a photoresist composition or the like (hereinafter, also referred to as a resist film). The photoresist composition may, for example, be a KrF resist composition, an ArF resist composition, an X-ray resist composition, or the like. Also, the term "inorganic film" as used in the present disclosure refers to a film that has an inorganic substance as a main component and is not a silicon oxide film or a silicon nitride film. The inorganic substance composes more than 50% of a material forming the film. Specific examples include a polycrystalline silicon film and an amorphous silicon film.

In the presently disclosed plasma etching method, "etching" refers to a technique that is used in a manufacturing process of a semiconductor device or the like for engraving a highly integrated fine pattern in a workpiece including a processing target and a non-processing target. Also, "plasma etching" refers to a technique in which a high-frequency electric field is applied to a processing gas to cause a glow discharge, the processing gas dissociates into chemically active ions, electrons, and neutral species, and etching is performed using chemical reactions and reactions through physical impact of these active species and an etching target material.

(Plasma Etching Method)

The presently disclosed plasma etching method includes an etching step of plasma etching a silicon oxide film and a silicon nitride film using a gas of a non-bromine-containing fluorocarbon together with a gas of a bromine-containing fluorocarbon compound represented by a compositional formula $C_3H_2BrF_3$ that is at least one of 2-bromo-3,3,3-trifluoropropene, (Z)-1-bromo-3,3,3-trifluoropropene, (E)-1-bromo-3,3,3-trifluoropropene, and 3-bromo-2,3,3-trifluoropropene. A silicon oxide film and a silicon nitride film can both be etched in the same etching step by plasma etching in which a gas of a non-bromine-containing fluorocarbon and a gas of any of these specific bromine-containing fluorocarbon compounds are used together as a processing gas.

The presently disclosed plasma etching method may further include a preparation step of setting a workpiece inside a processing vessel in advance of the etching step. The following describes each step.

<Preparation Step>

First, a workpiece having a multilayer laminate structure in which silicon oxide and silicon nitride films are stacked as a plurality of layers is set inside a dry etching chamber included in a plasma etching apparatus (i.e., inside a processing vessel), and the inside of the processing vessel is placed in a vacuum state by degassing. The presently disclosed plasma etching method can be implemented using a typical plasma etching apparatus without any specific limitations. In particular, the use of a reactive ion etching (RIE) apparatus is preferable. The RIE apparatus may, for example, be a helicon wave plasma etching apparatus, a high-frequency induction plasma etching apparatus, a parallel plate plasma etching apparatus, a magnetron plasma etching apparatus, a microwave plasma etching apparatus, or the like. In the present disclosure, a parallel plate plasma etching apparatus, a high-frequency induction plasma etching apparatus, or a microwave plasma etching apparatus can suitably be used. This is because high-density region plasma can easily be generated.

In the preparation step, the temperature of the workpiece may, for example, be adjusted to −50° C. or higher, more preferably −20° C. or higher, and even more preferably −10° C. or higher, and preferably to 300° C. or lower, more preferably 200° C. or lower, and even more preferably 100° C. or lower. The temperature of the workpiece can be controlled, for example, using a cooling apparatus and a cooling gas such as helium gas. The various gases described below are introduced into the processing vessel such as to each have a specific rate and pressure. The introduction rate of each gas may be determined in accordance with the volume ratio of the gases in the processing gas. The pressure inside the processing vessel while the processing gas is being supplied into the processing vessel is normally maintained as at least 0.0013 Pa and not higher than 1,300 Pa, and preferably at least 0.13 Pa and not higher than 5 Pa.

[Processing Gas]

The processing gas is a mixed gas of a gas of a non-bromine-containing fluorocarbon and a gas of a bromine-containing fluorocarbon compound represented by a compositional formula $C_3H_2BrF_3$ that is 2-bromo-3,3,3-trifluoropropene gas, (Z)-1-bromo-3,3,3-trifluoropropene gas, (E)-1-bromo-3,3,3-trifluoropropene gas, and/or 3-bromo-2,3,3-trifluoropropene gas.

Gases of bromine-containing fluorocarbon compounds represented by a compositional $C_3H_2BrF_3$ that include at least one unsaturated bond have conventionally been used in selective etching of silicon oxide films such as in PTL 1 described above. In PTL 1, an organic film that may be any of various resist films or an amorphous carbon film and a nitrogen-containing film of $Si_3N_4$ or the like are given as examples of materials for forming a mask that is a non-processing target. In other words, it was recognized that in a conventional technique such as that disclosed in PTL 1, a silicon nitride film is a non-processing target in an etching method using a gas of a bromine-containing fluorocarbon compound represented by a compositional formula $C_3H_2BrF_3$, and that the silicon nitride film is not etched by this gas.

However, as a result of original studies carried out by the inventors, the inventors discovered that, surprisingly, a silicon nitride film can also be selectively etched by using a gas of a compound having a specific structure from among gases of bromine-containing fluorocarbon compounds represented by a compositional formula $C_3H_2BrF_3$ as a mixture with a specific gas. The inventors carried out further studies and thereby made a new discovery that by using $C_3H_2BrF_3$ gas having a specific structure and a gas of a non-bromine-containing fluorocarbon together, a silicon oxide film and a silicon nitride film can both be selectively etched relative to a mask. In this manner, the inventors completed the present disclosure.

The mask may be an organic film or an inorganic film such as previously described, and is preferably an organic film formed from amorphous carbon or a resist film. A component dissociated from the $C_3H_2BrF_3$ gas is adsorbed onto an organic film, such as amorphous carbon or a resist film, or onto an inorganic film, and forms a polymer. An organic film formed from amorphous carbon or a resist film is protected by the formed polymer component such that etching of the organic film does not proceed. In contrast, etching of both a silicon oxide film and a silicon nitride film does proceed. Consequently, favorable selectivity can be achieved through the presently disclosed plasma etching method. The phrase "selectively etching both a silicon oxide film and a silicon nitride film" as used in the present specification means that a silicon oxide film and a silicon nitride film can both be etched in the same etching step with an etching selectivity ratio of 1.5 or more, and preferably 2.0 or more.

The etching selectivity ratio is obtained by dividing the etching rate of silicon oxide and silicon nitride films included in the multilayer laminate by the etching rate of the mask. These etching rates can be calculated by a method described in the EXAMPLES section of the present specification. A higher etching selectivity ratio means that silicon oxide and silicon nitride films that are processing targets can be etched more selectively than the mask. More specifically, the etching selectivity ratio is high when the etching rates of both a silicon oxide film and a silicon nitride film are high and when the mask is not etched, or the etching rate thereof is low.

—Gas of Bromine-Containing Fluorocarbon Represented by Compositional Formula $C_3H_2BrF_3$ ($C_3H_2BrF_3$ Gas)—

The processing gas is required to include a gas of a specific compound represented by a compositional formula $C_3H_2BrF_3$ (hereinafter, also referred to as "$C_3H_2BrF_3$ gas"). More specifically, the $C_3H_2BrF_3$ gas is required to include one or more gases selected from the group consisting of 2-bromo-3,3,3-trifluoropropene gas, (Z)-1-bromo-3,3,3-trifluoropropene gas, (E)-1-bromo-3,3,3-trifluoropropene gas, and 3-bromo-2,3,3-trifluoropropene gas. Gases of these specific compounds have comparatively short atmospheric lifetimes and low environmental impact as a result of including one unsaturated bond in molecules thereof. Moreover, 2-bromo-3,3,3-trifluoropropene has a boiling point of 33° C. to 34° C., (Z)-1-bromo-3,3,3-trifluoropropene has a boiling point of 57° C. to 58° C., (E)-1-bromo-3,3,3-trifluoropropene has a boiling point of 39° C. to 39.5° C., and 3-bromo-2,3,3-trifluoropropene has a boiling point of 65° C., which facilitates handling during supply thereof into a processing vessel as a processing gas. In a number of embodiments, the $C_3H_2BrF_3$ gas may include 2-bromo-3,3,3-trifluoropropene gas. The etching selectivity ratio can be further improved when the $C_3H_2BrF_3$ gas included in the processing gas includes 2-bromo-3,3,3-trifluoropropene gas. In particular, in a number of embodiments, the processing gas may include just 2-bromo-3,3,3-trifluoropropene gas as the $C_3H_2BrF_3$ gas. In this case, the plasma etching method is highly efficient and convenient because only a small number of types of gases are used in the plasma etching method.

—Gas of Non-Bromine-Containing Fluorocarbon—

The processing gas further includes a gas of a non-bromine-containing fluorocarbon in addition to the $C_3H_2BrF_3$ gas described above. The non-bromine-containing fluorocarbon may be a gas of any known fluorocarbon that does not contain bromine. In other words, in addition to carbon, fluorine, and hydrogen atoms, the non-bromine-containing fluorocarbon may contain atoms other than bromine atoms. The non-bromine-containing fluorocarbon is preferably composed of carbon, fluorine, and hydrogen atoms. For example, the non-bromine-containing fluorocarbon may be at least one compound from among compounds represented by compositional formulae $CF_4$, $CSF_B$, $C_4F_8$, $C_3H_2F_4$, $CH_3F$, $CHF_3$, $CH_2F_2$, $C_4F_6$, and $C_5F_8$, and is preferably at least one compound from among $CF_4$, $CSF_B$, and $C_4F_8$. One of these compounds may be used, or a plurality of these compounds may be used as a mixture. When the processing gas includes a gas of a non-bromine-containing fluorocarbon in addition to the $C_3H_2BrF_3$ gas, a silicon nitride film can be selectively etched relative to a mask in addition to and in the same etching step as a silicon oxide film. Note that in the case of a compound among the non-bromine-containing fluorocarbons represented by the various compositional formulae presented above that is a compound for which a number of isomers exist, the compound may be any of these isomers so long as the isomer can be represented by the corresponding compositional formula.

—Volume Ratio of Gas of Non-Bromine-Containing Fluorocarbon in Processing Gas—

The volume ratio of the non-bromine-containing fluorocarbon gas in the processing gas relative to the $C_3H_2BrF_3$ gas when the volume of the $C_3H_2BrF_3$ gas is taken to be 1 is more than 0, preferably 0.05 or more, and more preferably 0.1 or more, and is preferably less than 2.5, more preferably 2.2 or less, and even more preferably 2.0 or less. When the volume ratio of the non-bromine-containing fluorocarbon gas is less than the upper limit set forth above, the etching selectivity ratio and etching rate can be improved in a good balance. Moreover, when the volume ratio of the non-bromine-containing fluorocarbon is at least the lower limit set forth above, mask loss can be favorably inhibited.

Note that in a case in which a plurality of types of $C_3H_2BrF_3$ gas and/or a plurality of types of non-bromine-containing fluorocarbon gas are used together, the volume ratio calculated based on the total volume thereof may be within any of the ranges set forth above.

—Other Gases—

Other gases such as a noble gas or oxygen gas may be used together with the processing gas in the etching step as necessary. The noble gas may, for example, be at least one selected from the group consisting of helium gas, argon gas, neon gas, krypton gas, and xenon gas. Of these gases, argon gas can suitably be used as the noble gas. Through mixing of a noble gas or oxygen gas with the processing gas, it is possible to adjust the etching rate as necessary.

—Mixing Ratio of Noble Gas—

In a case in which a noble gas is used in the etching step, the volume ratio of the noble gas when the volume of the processing gas including the $C_3H_2BrF_3$ gas and the non-bromine-containing fluorocarbon gas is taken to be 1 is normally 200 or less, preferably 50 or less, more preferably 10 or less, and even more preferably 3 or less, and is normally 0.1 or more.

—Mixing Ratio of Oxygen Gas—

In a case in which oxygen gas is used in the etching step, the volume ratio of the oxygen gas when the volume of the processing gas including the $C_3H_2BrF_3$ gas and the non-bromine-containing fluorocarbon gas is taken to be 1 is normally 50 or less, preferably 10 or less, and more preferably 1 or less, and is normally 0.1 or more.

Gases such as the $C_3H_2BrF_3$ gas, the non-bromine-containing fluorocarbon gas, the noble gas, and the oxygen gas are normally each independently filled into a container such as a gas cylinder, transported, and installed in connection with a plasma etching apparatus. Valves of the gas cylinders or the like are then opened so as to introduce the gases, in a specific ratio, into a processing vessel in which the action of plasma is received, and then etching proceeds in the etching step through the action of plasma on each gas.

<Etching Step>

The etching step is an etching step of selectively plasma etching a silicon oxide film and a silicon nitride film on a workpiece relative to a mask. This selective etching can be implemented by using a mixture of a $C_3H_2BrF_3$ gas and a non-bromine-containing fluorocarbon gas as a processing gas as previously described. The flow rates of both gases supplied into the processing vessel in the etching step are preferably adjusted such as to satisfy the volume ratio condition set forth above.

In the etching step, the inside of the processing vessel is preferably placed in a condition in which the value of a $CF_2/F$ ratio obtained through emission spectroscopy of gas satisfying the compositional formula $C_3H_2BrF_3$ is at least 0.10 and not more than 0.30. The value of the $CF_2/F$ ratio of the $C_3H_2BrF_3$ gas referred to in the present specification can be obtained by determining an intensity value $I_{CF2}$ for a bright line spectrum attributed to $CF_2$=263 nm) and an intensity value $I_F$ for a bright line spectrum ($\lambda$=703 nm) attributed to F from a spectrum obtained by emission spectroscopy in accordance with Japanese Industrial Standard K 0116 (JIS K 0116), and then calculating the value of $I_{CF2}/I_F$. The value of the $CF_2/F$ ratio can be controlled, for example, based on electrical power supplied to the inside of the processing vessel (i.e., voltage applied to an electrode included in the processing vessel).

The etching step is preferably carried out under a high-density plasma atmosphere from a viewpoint of more favorably exhibiting the effects of plasma etching. More specifically, the plasma density in the etching step is not specifically limited but is preferably $10^{12}/cm^3$ or more, and more preferably $10^{12}/cm^3$ to $10^{13}/cm^3$.

The presently disclosed plasma etching method enables selective etching of both a silicon nitride film and a silicon oxide film relative to a mask in the same etching step without changing various etching conditions such as the flow rates of gases and the voltage applied to an electrode included in the processing vessel. Consequently, the presently disclosed plasma etching method enables efficient etching processing of a laminate including a silicon oxide film and a silicon nitride film.

EXAMPLES

The following provides a more specific description of the present disclosure based on examples. However, the present disclosure is not limited to the following examples.

Workpieces, a plasma etching apparatus, and plasma etching conditions used in the examples and comparative examples were as follows. Moreover, etching rate, etching selectivity ratio, and pattern shape were measured and evaluated as described below in the examples and comparative examples.

<Workpieces>

The following workpieces were used.

[Workpieces for Selectivity Ratio Evaluation]

A wafer including a silicon nitride film ($Si_3N_4$ film) layer of 1,000 nm in thickness formed on a monocrystalline silicon wafer, a wafer including a silicon oxide film ($SiO_2$ film) layer of 2,000 nm in thickness formed on a monocrystalline silicon wafer, and a wafer including an amorphous carbon film of 200 nm in thickness formed on a monocrystalline silicon wafer were used as workpieces for selectivity ratio evaluation. Each of these workpieces was set in an etching chamber of a parallel plate plasma etching apparatus.

[Workpiece for Pattern Shape Evaluation]

A wafer that was a multilayer laminate in which an amorphous carbon film layer (thickness: 400 nm) that had been subjected to patterning with a specific hole pattern was formed as a mask on a 10-layer laminate film (multilayer laminate film; thickness: 1,000 nm) disposed on a monocrystalline silicon wafer was used as a workpiece for pattern shape evaluation. The multilayer laminate film included silicon nitride films ($Si_3N_4$ films) and silicon oxide films ($SiO_2$ films) of 100 nm each in thickness stacked as a total of 10 layers (5 pairs) in an order of $Si_3N_4$ film/$SiO_2$ film/$Si_3N_4$ film/$SiO_2$ film and so on.

<Plasma Etching Apparatus>

A parallel plate plasma etching apparatus was used as the plasma etching apparatus. The parallel plate plasma etching apparatus included an upper electrode and a lower electrode inside an etching chamber (processing vessel). The separation between a lower surface of the upper electrode and an upper surface of the lower electrode was 35 mm. Moreover, the frequency of the upper electrode of the parallel plate plasma etching apparatus was 60 MHz and the frequency of the lower electrode of the parallel plate plasma generator was 2 MHz.

<Plasma Etching Conditions>

In an etching step, power of the upper electrode was set as 1,000 W, power of the lower electrode was set as 360 W, and pressure inside the processing vessel was maintained constant at 2.7 Pa (approximately 20 mTorr). Temperature conditions were set such that the temperature of the upper electrode was 60° C., the temperature of a side wall of the processing vessel was 60° C., and the temperature of the lower electrode was 20° C. The temperature of the workpiece was the same as the temperature of the lower electrode (i.e., 20° C.). The plasma etching time was set as 300 seconds in all of the examples and comparative examples.

<Etching Rate>

In each example or comparative example, the thickness of each workpiece for selectivity ratio evaluation obtained after completion of the etching step was measured by ellipsometry. A mask etching rate $ER^M$ (nm/min) was calculated by subtracting the thickness of the resultant amorphous carbon film from the initial thickness of the original amorphous carbon film, and then dividing by 5. A silicon oxide film etching rate [nm/min] and a silicon nitride film etching rate [nm/min] were each calculated by subtracting the thickness of the resultant silicon oxide film or silicon nitride film from the initial thickness of the original silicon oxide film or silicon nitride film, and then dividing by 5. An average etching rate $ER^{ave}$ for the silicon oxide film and the silicon nitride film was calculated by the following formula (I). According to the following formula (I), a harmonic mean value is calculated for the etching rates of the silicon oxide film and the silicon nitride film.

Average etching rate $ER^{ave}$ of silicon oxide film and silicon nitride film=(2×(Etching rate of $SiO_2$ film)×(Etching rate of $Si_3N_4$ film))/((Etching rate of $SiO_2$ film)+(Etching rate of $Si_3N_4$ film))     (I)

<Etching Selectivity Ratio>

An etching selectivity ratio (ES) was calculated by the following formula (II) using the etching rates $ER^M$ and $ER^{ave}$ that were calculated as described above.

Etching selectivity ratio(ES)=($ER^{ave}/ER^M$)     (II)

<Pattern Shape>

A workpiece for pattern shape evaluation that had undergone an etching step was inspected using a scanning electron microscope. The occurrence of mask loss and the occurrence of hole blocking were inspected at the surface of the workpiece for pattern shape evaluation and were evaluated by the following standards.

[Mask Loss]

Evaluation of "No" for mask loss: 5% or more of total mask area remains

Evaluation of "Yes" for mask loss: More than 95% of total mask area is lost

[Hole Blocking]

Evaluation of "No" for hole blocking: Not all holes in hole pattern are blocked

Evaluation of "Yes" for hole blocking: All holes in hole pattern are blocked

Example 1

First, the workpiece for pattern shape evaluation was set in the processing vessel and the inside of the processing vessel was placed in a vacuum state in a preparation step. Next, 2-bromo-3,3,3-trifluoropropene ($C_3H_2BrF_3$) at a rate of 14 sccm, tetrafluoromethane ($CF_4$) as a non-bromine-containing fluorocarbon gas at a rate of 16 sccm, oxygen at a rate of 15 sccm, and argon at a rate of 40 sccm were introduced into the processing vessel, and an etching step was performed under the previously described plasma etching conditions. An etching step was performed in the same manner with respect to the workpieces for selectivity ratio evaluation. The resultant workpieces for selectivity ratio evaluation were used to calculate the etching rates and etching selectivity ratio by the previously described methods. Moreover, the resultant workpiece for pattern shape evaluation was used to evaluate pattern shape by the previously described method. The results are shown in Table 1.

Example 2

Plasma etching was performed under the same conditions as in Example 1 with the exception that the introduction rates of 2-bromo-3,3,3-trifluoropropene ($C_3H_2BrF_3$), tetrafluoromethane ($CF_4$), and oxygen were changed as shown in Table 1. Measurements and evaluations were carried out in the same way as in Example 1. The results are shown in Table 1.

Examples 3 and 4

Plasma etching was performed under the same conditions as in Example 1 with the exception that the introduction rates of 2-bromo-3,3,3-trifluoropropene ($C_3H_2BrF_3$) and oxygen were changed as shown in Table 1, and trifluoromethylsulfur pentafluoride ($CSF_B$) was introduced at a rate of 5 sccm as a non-bromine-containing fluorocarbon gas instead of tetrafluoromethane ($CF_4$). Measurements and evaluations were carried out in the same way as in Example 1. The results are shown in Table 1.

Example 5

Plasma etching was performed under the same conditions as in Example 1 with the exception that octafluorocyclobutane ($C_4F_8$) was introduced at a rate of 30 sccm as a non-bromine-containing fluorocarbon gas instead of tetrafluoromethane ($CF_4$). Measurements and evaluations were carried out in the same way as in Example 1. The results are shown in Table 1.

Comparative Example 1

Plasma etching was performed under the same conditions as in Example 1 with the exception that the introduction rates of 2-bromo-3,3,3-trifluoropropene ($C_3H_2BrF_3$) and oxygen were changed as shown in Table 1, and a non-bromine-containing fluorocarbon gas was not introduced. Measurements and evaluations were carried out in the same way as in Example 1. The results are shown in Table 1.

Comparative Example 2

Plasma etching was performed under the same conditions as in Example 1 with the exception that a non-bromine-containing fluorocarbon gas was not introduced. Measurements and evaluations were carried out in the same way as in Example 1. The results are shown in Table 1.

Comparative Example 3

Plasma etching was performed under the same conditions as in Example 1 with the exception that a bromine-containing fluorocarbon gas represented by a compositional formula $C_3H_2BrF_3$ was not introduced. Measurements and evaluations were carried out in the same way as in Example 1. The results are shown in Table 1.

Comparative Example 4

Plasma etching was performed under the same conditions as in Example 2 with the exception that a bromine-containing fluorocarbon gas represented by a compositional formula $C_3H_2BrF_3$ was not introduced. Measurements and evaluations were carried out in the same way as in Example 1. The results are shown in Table 1.

Comparative Example 5

Plasma etching was performed under the same conditions as in Example 1 with the exception that a non-bromine-containing fluorocarbon gas was not introduced and the amount of oxygen that was introduced was changed as shown in Table 1. Measurements and evaluations were carried out in the same way as in Example 1. The results are shown in Table 1.

Comparative Examples 6 to 8

A bromine-containing fluorocarbon gas represented by a compositional formula $C_3H_2BrF_3$ was not introduced and 2,3,3,3-tetrafluoropropene ($C_3H_2F_4$) was introduced at the rate shown in Table 1 instead. Moreover, the introduction rates of tetrafluoromethane ($CF_4$) as a non-bromine-containing fluorocarbon gas and oxygen were changed as shown in Table 1 in Comparative Examples 6 and 7. With the exception of these points, plasma etching was performed under the same conditions as in Example 1. Measurements and evaluations were carried out in the same way as in Example 1. The results are shown in Table 1.

introduction rate was roughly the same as in Example 1, only a silicon oxide film at an outermost surface under the mask in the multilayer laminate was etched, and etching stopped at a silicon nitride film. This demonstrates that when a bromine-containing fluorocarbon gas and a non-bromine-containing fluorocarbon gas are not used together, etching of a silicon nitride film cannot be performed even under conditions where etching of a silicon oxide film is possible. It can be seen, therefore, that when a bromine-containing fluorocarbon gas and a non-bromine-containing fluorocarbon gas are not used together, it may not be possible to etch a silicon nitride film and thus it may not be possible to etch a multilayer laminate.

Furthermore, mask loss or hole blocking occurred in Comparative Examples 6 to 8 in which 2,3,3,3-tetrafluoropropene was used instead of 2-bromo-3,3,3-trifluoropropene. This demonstrates that a multilayer laminate cannot be selectively etched when a bromine-containing fluorocarbon gas and a non-bromine-containing fluorocarbon gas are not used together because a good pattern cannot be formed.

INDUSTRIAL APPLICABILITY

According to the present disclosure, it is possible to etch a silicon oxide film and a silicon nitride film with high selectivity in the same etching step using a plasma etching gas having comparatively low environmental impact.

TABLE 1

|  |  |  |  | Examples |  |  |  |  | Comparative examples |  |  |  |  |  |  |  |
|---|---|---|---|---|---|---|---|---|---|---|---|---|---|---|---|---|
|  |  |  |  | 1 | 2 | 3 | 4 | 5 | 1 | 2 | 3 | 4 | 5 | 6 | 7 | 8 |
| Conditions | Processing gas [sccm] | Br-containing FC gas | $C_3H_2BrF_3$ | 14 | 30 | 22 | 22 | 14 | 30 | 14 | — | — | 14 | — | — | — |
|  |  | Non-Br-containing FC gas | $C_3H_2F_4$ | — | — | — | — | — | — | — | — | — | — | 30 | 30 | 14 |
|  |  |  | $CF_4$ | 16 | 20 | — | — | — | — | — | 16 | 20 | — | 20 | 20 | 16 |
|  |  |  | $CSF_8$ | — | — | 5 | 5 | — | — | — | — | — | — | — | — | — |
|  |  |  | $C_4F_8$ | — | — | — | — | 30 | — | — | — | — | — | — | — | — |
|  |  | Volume ratio (Non-Br-containing FC gas/Br-containing FC gas) [—] |  | 1.14 | 0.67 | 0.23 | 0.23 | 2.14 | — | — | — | — | — | — | — | — |
|  |  | $O_2$ [sccm] |  | 15 | 40 | 16 | 17 | 15 | 40 | 40 | 15 | 40 | 22 | 40 | 25 | 15 |
|  |  | Ar [sccm] |  | 40 | 40 | 40 | 40 | 40 | 40 | 40 | 40 | 40 | 40 | 40 | 40 | 40 |
| Evaluation | Laminate structure etching depth [nm] |  |  | 570 | 832 | 433 | 488 | 399 | — | — | — | — | 101 | — | — | — |
|  | $SiO_2$—$Si_3N_4$ average etching rate [nm/min] |  |  | 114.0 | 166.4 | 86.6 | 97.5 | 79.7 | — | — | — | — | 20.3 | — | — | — |
|  | Mask etching rate [nm/min] |  |  | 32.9 | 34.7 | 24.2 | 31.2 | 24.5 | — | — | — | — | 10.5 | — | — | — |
|  | Selectivity ratio [—] |  |  | 3.48 | 4.8 | 3.58 | 3.13 | 3.25 | — | — | — | — | 1.9 | — | — | — |
|  | Pattern shape | Mask loss |  | No | No | No | No | No | Yes | Yes | Yes | Yes | — | Yes | — | Yes |
|  |  | Hole blocking |  | No | No | No | No | No | — | — | — | — | — | — | Yes | — |

It can be seen from Table 1 that in Examples 1 to 5 in which 2-bromo-3,3,3-trifluoropropene and a non-bromine-containing fluorocarbon gas were used together, it was possible to etch a silicon oxide film and a silicon nitride film in the same etching step with high selectivity in etching of a multilayer laminate including stacked silicon oxide and silicon nitride films, and also having a mask.

In contrast, it can be seen that mask loss may occur when 2-bromo-3,3,3-trifluoropropene or tetrafluoromethane is used individually as in Comparative Examples 1 to 4 (i.e., when a bromine-containing fluorocarbon gas and a non-bromine-containing fluorocarbon gas are not used together). In these comparative examples, etching of the multilayer laminate could not be performed due to this mask loss.

Moreover, in Comparative Example 5 in which 2-bromo-3,3,3-trifluoropropene was used individually and the oxygen

The invention claimed is:

1. A plasma etching method for etching a multilayer laminate in which a silicon oxide film and a silicon nitride film are stacked, comprising
   an etching step of plasma etching the silicon oxide film and the silicon nitride film using a gas of a non-bromine-containing fluorocarbon together with a gas of a bromine-containing fluorocarbon compound represented by a compositional formula $C_3H_2BrF_3$ that is at least one of 2-bromo-3,3,3-trifluoropropene, (Z)-1-bromo-3,3,3-trifluoropropene, (E)-1-bromo-3,3,3-trifluoropropene, and 3-bromo-2,3,3-trifluoropropene.

2. The plasma etching method according to claim 1, wherein a volume ratio of the gas of the non-brominecontaining fluorocarbon relative to the gas of the bromine-containing fluorocarbon compound in the etching step is less than 2.5.

3. The plasma etching method according to claim 1, wherein the gas of the bromine-containing fluorocarbon compound includes 2-bromo-3,3,3-trifluoropropene gas.

* * * * *